(12) United States Patent
Nan et al.

(10) Patent No.: US 11,119,469 B2
(45) Date of Patent: *Sep. 14, 2021

(54) METHOD OF MAKING SEMICONDUCTOR DEVICES AND A CONTROL SYSTEM FOR PERFORMING THE SAME

(71) Applicant: TAIWAN SEMICONDUCTOR MANUFACTURING COMPANY, LTD., Hsinchu (TW)

(72) Inventors: Ching-Hsi Nan, Taichung (TW); Yu-Hsiu Fu, Xinfeng Township (TW); Chia-Jung Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/844,533

(22) Filed: Apr. 9, 2020

(65) Prior Publication Data

US 2020/0233401 A1 Jul. 23, 2020

Related U.S. Application Data

(63) Continuation of application No. 14/015,346, filed on Aug. 30, 2013, now Pat. No. 10,642,255.

(51) Int. Cl.
*G05B 19/41* (2006.01)
*G05B 19/418* (2006.01)

(52) U.S. Cl.
CPC ..... *G05B 19/418* (2013.01); *G05B 19/41875* (2013.01); *G05B 2219/45031* (2013.01); *Y02P 90/02* (2015.11); *Y02P 90/80* (2015.11)

(58) Field of Classification Search
None
See application file for complete search history.

(56) References Cited

U.S. PATENT DOCUMENTS 4,388,731 A * 6/1983 King ............... H03G 3/344
455/221
5,249,016 A 9/1993 Tanaka
(Continued)

OTHER PUBLICATIONS

N.Q. Wu and M.C. Zhou, "Modeling, Analysis and Control of Dual-Arm Cluster Tools With Residency Time Constraint and Activity Time Variation Based on Petri Nets", Oct. 2010, IEEE Transactions on Automation Science and Engineering, vol. 9, No. 2, Apr. 2012. (Year: 2010).*

(Continued)

*Primary Examiner* — Mohammad Ali
*Assistant Examiner* — Kelvin Booker
(74) *Attorney, Agent, or Firm* — Hauptman Ham, LLP

(57) ABSTRACT

A method includes calculating a processing tool offset for a processing tool based on process control parameters, wherein the processing tool offset is a first portion of a process offset time attributable to a processing tool. The method further includes calculating a product offset based on the process control parameters, wherein the product tool offset is a second portion of the process offset time attributable to a product. The method further includes determining whether the product offset is stable based on a difference between a processing time for different products being within a pre-determined tolerance and a number of processed wafers exceeding a threshold amount. The method further includes calculating an offset time for processing the product using the processing tool based on the calculated processing tool offset, without considering the product offset in response to a determination that the product offset is stable.

17 Claims, 5 Drawing Sheets

(56) References Cited

U.S. PATENT DOCUMENTS

| | | | |
|---|---|---|---|
| 5,362,585 A * | 11/1994 | Adams | G03F 7/70241 356/302 |
| 5,630,070 A * | 5/1997 | Dietrich | G06Q 10/0631 705/7.23 |
| 5,696,835 A | 12/1997 | Hennessey et al. | |
| 5,971,585 A * | 10/1999 | Dangat | G06Q 10/06 700/102 |
| 6,249,643 B1 * | 6/2001 | Mimura | H04N 5/335 386/224 |
| 6,292,255 B1 | 9/2001 | McCullough | |
| 6,393,334 B1 | 5/2002 | Lewis et al. | |
| 6,417,014 B1 | 7/2002 | Lam et al. | |
| 6,625,512 B1 | 9/2003 | Goodwin | |
| 6,694,284 B1 | 2/2004 | Nikoonahad et al. | |
| 6,812,045 B1 | 11/2004 | Nikoonahad et al. | |
| 6,961,626 B1 | 11/2005 | Paik | |
| 7,106,425 B1 | 9/2006 | Bultman et al. | |
| 7,127,304 B1 | 10/2006 | Gould et al. | |
| 7,634,325 B2 | 12/2009 | Wang et al. | |
| 9,158,301 B2 | 10/2015 | Wu et al. | |
| 2002/0106848 A1 | 8/2002 | Wack et al. | |
| 2002/0107650 A1 | 8/2002 | Wack et al. | |
| 2002/0180961 A1 | 12/2002 | Wack et al. | |
| 2002/0180986 A1 | 12/2002 | Nikoonahad et al. | |
| 2002/0182760 A1 | 12/2002 | Wack et al. | |
| 2003/0224619 A1 | 12/2003 | Onon et al. | |
| 2004/0267506 A1 | 12/2004 | Bowley, Jr. et al. | |
| 2005/0055122 A1 * | 3/2005 | Lin | G03F 7/70633 700/121 |
| 2005/0154484 A1 | 7/2005 | Lee et al. | |
| 2005/0171627 A1 | 8/2005 | Funk et al. | |
| 2005/0181571 A1 | 8/2005 | Lin et al. | |
| 2005/0187649 A1 | 8/2005 | Funk et al. | |
| 2005/0288812 A1 | 12/2005 | Cheng et al. | |
| 2006/0007453 A1 | 1/2006 | Horak et al. | |
| 2006/0008715 A1 * | 1/2006 | Chen | G03F 7/70633 430/30 |
| 2006/0064194 A1 * | 3/2006 | Lee | G03F 7/70633 700/121 |
| 2006/0195294 A1 | 8/2006 | Archie et al. | |
| 2006/0195295 A1 | 8/2006 | Archie et al. | |
| 2006/0265098 A1 | 11/2006 | Gould et al. | |
| 2006/0271225 A1 | 11/2006 | Schulze et al. | |
| 2008/0057418 A1 | 3/2008 | Seltmann et al. | |
| 2008/0140590 A1 | 6/2008 | Shen | |
| 2008/0248412 A1 * | 10/2008 | Stuber | H01L 22/12 430/30 |
| 2008/0275588 A1 * | 11/2008 | Wang | H01L 22/12 700/121 |
| 2009/0116727 A1 | 5/2009 | Jin et al. | |
| 2009/0122304 A1 | 5/2009 | Jin et al. | |
| 2009/0276075 A1 | 11/2009 | Good et al. | |
| 2010/0191363 A1 | 7/2010 | Zou | |
| 2010/0196716 A1 | 8/2010 | Ohta et al. | |
| 2010/0255613 A1 | 10/2010 | Tsen et al. | |
| 2011/0172958 A1 | 7/2011 | Archie et al. | |
| 2011/0213478 A1 | 9/2011 | Tsen et al. | |
| 2012/0016509 A1 | 1/2012 | Wu et al. | |
| 2012/0139123 A1 * | 6/2012 | Daubenspeck | G06F 30/39 257/774 |
| 2013/0010579 A1 | 1/2013 | Matsuda et al. | |
| 2013/0013097 A1 | 1/2013 | Wu et al. | |
| 2013/0060354 A1 | 3/2013 | Choi et al. | |
| 2014/0031969 A1 | 1/2014 | Baseman et al. | |
| 2014/0048906 A1 | 2/2014 | Shim et al. | |
| 2014/0161361 A1 * | 6/2014 | Nan | G06T 7/001 382/220 |
| 2014/0316552 A1 * | 10/2014 | Shindo | B23P 23/04 700/179 |
| 2015/0066592 A1 | 3/2015 | Ehm et al. | |
| 2016/0290796 A1 | 10/2016 | Levy et al. | |

OTHER PUBLICATIONS

Y.Q., N.iQ. Wu and M.C. Zhou, "Real-Time Scheduling of Single-Arm Cluster Tools Subject to Residency Time Constraints and Bounded Activity Time Variation", Sep. 2011, IEEE Transactions on Automation Science and Engineering, vol. 9, No. 3, Jul. 2012. (Year: 2011).*

D. Crow, New Vision Systems, "Improving overlay performance in lithography tools using run-to-run control", 2007, Micro Magazine online. (Year: 2007).*

G. S. May, and C.J. Spanos, "Fundamentals of Semiconductor Manufacturing and Process Control", 2006 by John Wiley & Sons, Inc. (Year: 2006).*

Kulkarni et al., "Advanced Data Mining Techniques to improve IC FAB Yield", Nov. 2014, V9, Iss. 2, Applied Materials. (Year: 2014).*

Lee, S.H.; Chen, K.-N. and Lu, J.J.-Q., "Wafer-to-Wafer Alignment for Three-Dimensional Integration: A Review", Aug. 2011, Journal of Microelectromechanical Systems, vol. 20, No. 4.

Qiao, Y.; Wu, N. and Zhou, M., "Petri Net Modeling and Wafer Sojourn Time Analysis of Single-Arm Cluster Tools with Residency Time Contraints and Activity Time Variation", Aug. 2012, IEEE Transactions on Semiconductor Manufacturing, vol. 25, No. 3.

Swaminathan, J.M., "Tool Procurement Planning for Wafer Fabrication Facilities: A Scenario-Based Approach", 2000, IE Transactions, 34, 145-155.

Akcah, E.; Nemoto, K and Uzsoy, R., "Cycle-Time Improvements for Photolithography Process in Semiconductor Manufacturing", Feb. 2001, IEEE Transactions on Semiconductor Manufacturing, vol. 14, No. 1.

He, P.O. and Wang, J., "Fault Detection Using the k-Nearest Neighbor Rule for Semiconductor Manufacturing Processes", Nov. 2007, IEEE Transactions on Semiconductor Manufacturing, vol. 20, No. 4.

Kumar, S.; Nassehi, A.; Newman, S.T.; Allen, R.D. and Tiwari, M.K., "Process Control in CNC Manufacturing for Discrete Components: A STEP-NC Compliant Framework", 2007, Robotics and Computer-Integraded Manufacturing, No. 23.

Qin, S.J.; Cherry, G.; Good, R.; Wang, J. and Harrison, C.A., "Semiconductor Manufacturing Process Control and Monitoring: A Fab-Wide Framework", 2006, Journal of Process Control, No. 16.

Su, A.-J., Jeng, J.-C.; Huang, H.-P.; Yu, C.-C.; Hung, S.-Y. and Chao, C.-K., "Control Relevant Issues in Semiconductor Manufacturing: Overview with Some New Results", 2007, Control Engineering Practice, No. 15.

Vargas-Villamil, Fd.; Rivera, D.E. and Kempf, K.G., "A Hierarchical Approach to Production Control of Reentrant Semiconductor Manufacturing Lines", Jul. 2003, IEEE Transactions on Control Systems Technology, vol. 11, No. 4.

* cited by examiner

METHOD OF MAKING SEMICONDUCTOR DEVICES AND A CONTROL SYSTEM FOR PERFORMING THE SAME

PRIORITY CLAIM

This application is a continuation of U.S. application Ser. No. 14/015,346, filed Aug. 30, 2013, which incorporated herein by reference in its entirety.

BACKGROUND

Due to imperfections and process variations, machinery used to manufacture semiconductor devices have offset times with respect to calculated processing times. A calculated processing time is a theoretical time for completing a processing step assuming ideal conditions. An offset time is a variation between the calculated processing time and an actual time for completing the processing step. In some approaches, the offset time is determined by processing a group of test wafers and analyzing the test wafers to determine whether the processing step was properly completed, whether the processing step was not properly completed or whether the test wafers were over processed.

Preventive maintenance is performed on machinery used to fabricate semiconductor devices in order to maintain the machinery in working order. During preventive maintenance, a backup machine is used in place of the machinery. An offset time of the backup machine is often different from an offset time of the machinery normally used to fabricate the semiconductor devices.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
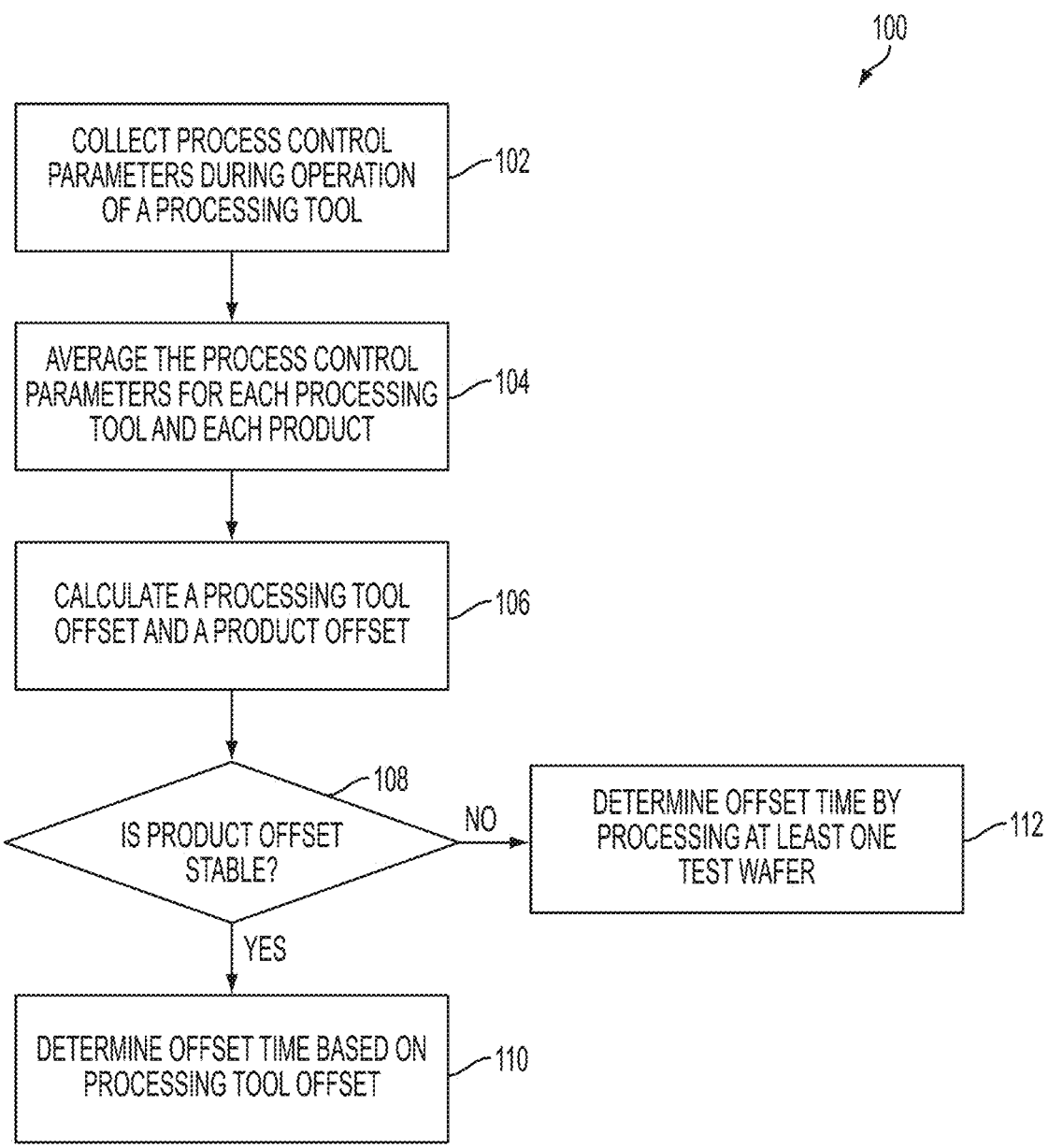
FIG. 1 is a flow chart of a method of determining an offset time in accordance with one or more embodiments.

FIG. 1 is a flow chart of a method 100 of determining an offset time in accordance with one or more embodiments. In operation 102, process control parameters are collected during operation of a processing tool. During semiconductor device manufacturing, each process tool is configured to perform a specific task or set of tasks. The process control parameters include a processing time the processing tool to perform the specific task or set of tasks on each type of product. The process control parameters also include a type of product processed and whether the product passed quality control tests. In some embodiments, the processing tool is used during normal operation of manufacturing semiconductor devices. In some embodiments, the processing tool is a backup processing tool used in place of the normal processing tool during a preventive maintenance cycle.

Figure 2:
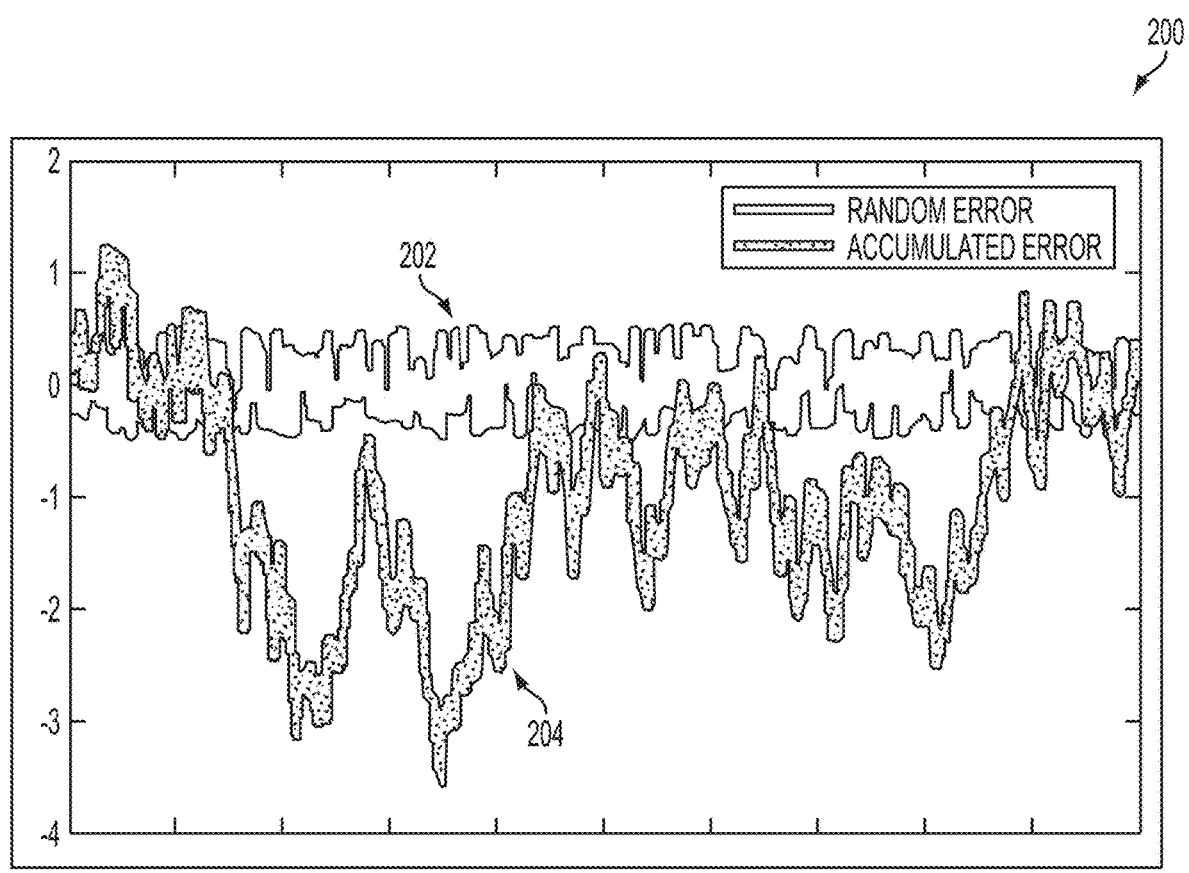
FIG. 2 is a graph of error versus different processing tools in accordance with one or more embodiments.

FIG. 2 is a graph 200 of an error versus different processing tools in accordance with one or more embodiments. An X-axis of graph 200 indicates different processing tools. A Y-axis of graph 200 is an arbitrary unit for measuring the production error. Graph 200 indicates a random error 202 associated with minor process variations during fabrication of the semiconductor devices. In some embodiments, random error 202 is unavoidable to some degree. Graph 200 also indicates an accumulated error 204 which is a combination of random error 202 and error introduced due to the processing tool and the product being processed. When a magnitude of accumulated error 204 exceeds a threshold value, the product fails quality control tests. Maintaining the accumulated error 204 within the threshold value increases production yield.

By collecting data on the process control parameters, e.g., in operation 102, a performance of specific product/processing tool combinations are able to be determined over time by analyzing historical data. Once the performance of the specific product/processing tool combinations is known, an offset time for adjusting the processing time is able to be determined to reduce accumulated error 204 to fall within the threshold value so that the products pass quality control tests. In some embodiments, the offset time is determined using statistical analysis of historical data. In some instances, the historical data is obtained using test wafers. In some embodiments, the historical data is obtained during previous operation of the processing tool. However, increased time used for determining the offset time for specific product/processing tool combinations reduces a yield of the semiconductor device fabrication process.

In at least one example, the processing tool is an etching chamber and the specific task is etching a trench. During operation, a wafer is introduced into the etching chamber. In some embodiments, the wafer includes additional layers over a substrate and the additional layers are subjected to an etching process. In some embodiments, the wafer does not include additional layers and the substrate is subjected to the etching process. Based on a material being etched, a type of etchant and other parameters, a theoretical processing time is able to be calculated. A difference exists between the theoretical processing time and an actual etching time to properly complete etching the trench. This difference is call the offset time. Due to process variations, e.g., flow rates of materials into the etching chamber, purity of the etchant, etc., or variations within between etching chambers, the offset time between respective etching chambers is also different.

Whenever a new machine is introduced into a semiconductor device fabrication process, an offset time is determined. For example, when a first etching chamber is subject to preventive maintenance, a backup etching chamber is used while the first etching chamber is offline. The backup etching chamber is inserted into the production process by directing wafers to the backup etching chamber. In some embodiments, wafers are directed to the backup etching chamber using front opening universal pods (FOUPs) to carry wafers from the first etching chamber to the backup etching chamber. In some embodiments, wafers are directed to the backup etching chamber using FOUPs to carry wafers from a processing tool used prior to the etching process to the backup etching chamber. In some embodiments, one backup etching chamber is used during manufacture of several different products.

The backup etching chamber has a different offset time than the first etching chamber. In some approaches, each time the backup etching chamber is used a group of test wafers for a specific product are processed using the backup etching chamber. The group of test wafers is then analyzed to determine the offset time for the backup etching chamber for each type of product. In at least one example, a linear relationship is applicable to determine the offset time. In some embodiments, the linear relationship for an etching process is represented by Formula 1:

$$\text{Etched Amount} = a * \text{Target Depth} + \text{Offset(time, tool, product)} \quad (1)$$

where the Etched Amount is an actual amount of material removed by the etching process, a is an etch rate of the etchant on the product material, Target Depth is the desired trench depth, and Offset is the offset time. The Offset is a function of the processing time, the processing tool and the product being processed.

Returning to FIG. 1, in operation 104, an average of the process control parameters of each process tool and each product is calculated. By averaging the process control parameters, an impact of extraneous processing variables, e.g., substrate or layer defect, on the process control parameters is reduced.

Figure 3:
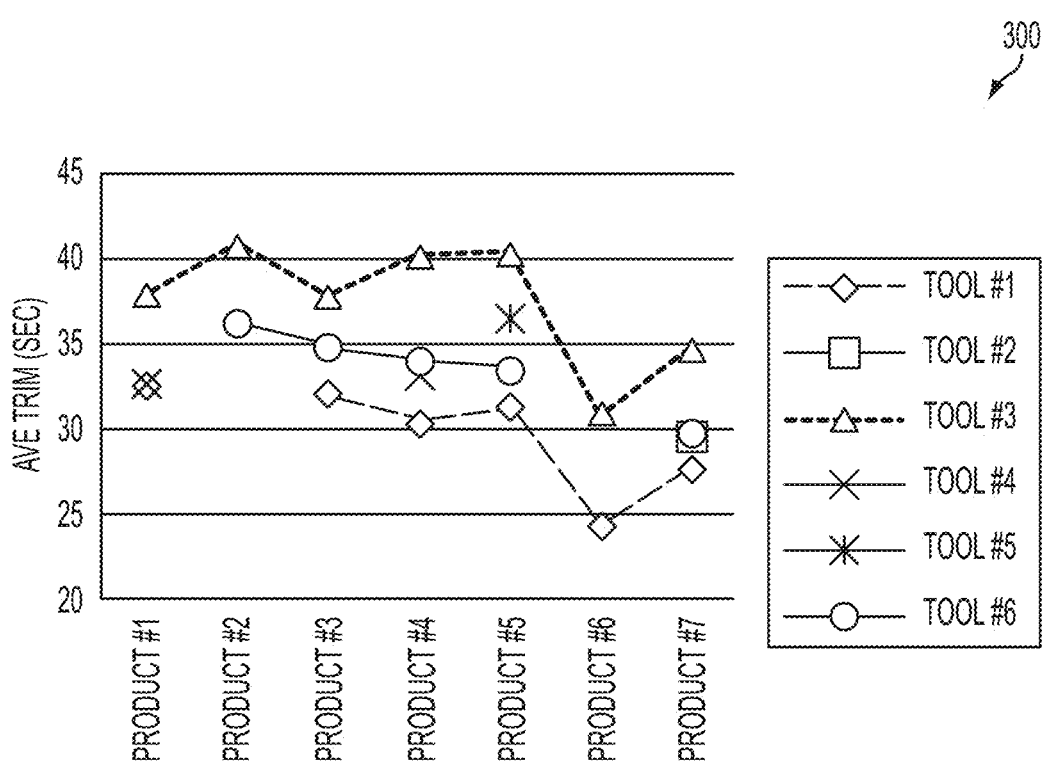
FIG. 3 is a graph of an average processing time for different products in a variety of processing tools in accordance with one or more embodiments.

FIG. 3 is a graph 300 of an average processing time for different products for a variety of processing tools in accordance with one or more embodiments. An X-axis of graph 300 indicates different products. A Y-axis of graph 300 indicates an average processing time. Different processing tools are indicated based on the legend in graph 300. Using the example of an etching process, each tool Tool #1-Tool #6 indicates a different etching chamber and each product Product #1-Product #7 indicates a different semiconductor device. As indicated by graph 300, the processing time for each product/processing tool combination varies.

Using Tool #3 as an example, assuming a theoretical processing time of 35 seconds, the average offset time with respect to the product #1/tool #3 combination to product #5/tool #3 combination is a positive value, indicating an increased processing time, with respect to the theoretical processing time, is used to reach the desired trench depth. The average offset time with respect to the product #6/tool #3 combination is negative, indicating a decreased processing time, with respect to the theoretical processing time, is used to reach the desired trench depth. Graph 300 indicates the average processing time of the product #7/tool #3 combination is nearly equal to the theoretical processing time meaning the offset time is nearly zero.

Returning to FIG. 1, in operation 106 a processing tool offset and a product offset are calculated. Using the average processing time for the product/processing tool combinations, a portion of the offset which is attributable to each of the product and the processing tool in each product/processing tool combination is able to be determined. By separating the offset based on the contribution from the product and the contribution from the processing tool Formula 1 is modified as seen in Formula 2:

$$\text{Etched Amount} = a * \text{Target Depth} + \text{Tool Offset(time)} + \text{Product Offset(time)} \quad (2)$$

where Tool Offset is a portion of the offset contributed by the processing tool, which is a function of processing time, and the Product Offset is a portion of the offset contributed by the product, which is also a function of processing time. Separating the offset into the processing tool offset and the product offset enables identification of a source of the offset for the product/processing tool combination.

Figure 4:
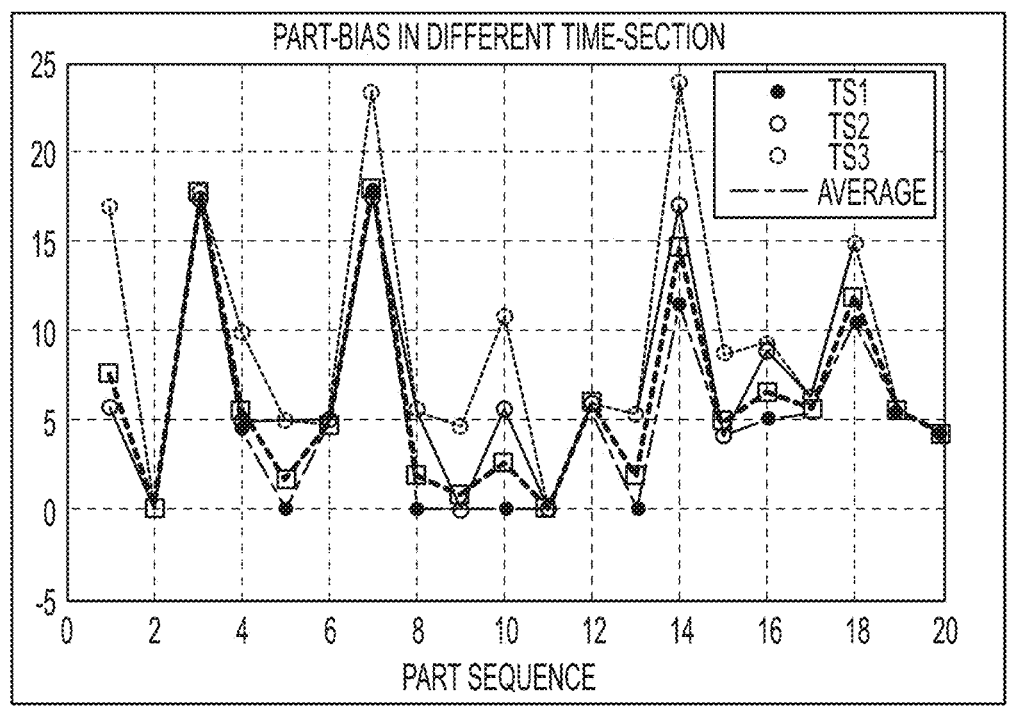
FIG. 4 is a graph of a processing time for a variety of products in accordance with one or more embodiments.

FIG. 4 is a graph 400 of a processing time for a variety of products in accordance with one or more embodiments. An X-axis of graph 400 indicates different processes performed on the product. A Y-axis of graph 300 indicates an offset of the process. Plots having circular shaped data points indicate different individual products. A plot having rectangular shaped data points indicates an average of the offset for the products. Graph 400 indicates that each product experiences a similar offset during each process. Therefore, the portion of the offset that is contributed by the products in graph 400 is able to be considered independent of processing time. By considering the product contributed offset to be independent of processing time, Formula 2 is modified as seen in Formula 3:

$$\text{Etched Amount} = a * \text{Target Depth} + \text{Tool Offset(time)} + \text{Product Offset} \quad (3)$$

where the Product Offset is a portion of the offset contributed by the product, which is independent of processing time. By determining that product offset is independent of processing time, the determination of the total offset time focuses on the offset contributed only by the processing tool.

If the test wafers approach from above is applied to an example semiconductor device fabrication process which includes 36 different products and 10 different processing tools, 360 different groups of test wafers would be used to determine the offset time for each product/processing tool combination. Each group of test wafers takes, e.g., approximately 1 day to process and analyze. As a result, determining the offset time for all product/processing tool combinations takes approximately 360 days.

In contrast, using method 100 reduces a number of groups of test wafers to 10 if the product offset is determined to be independent of processing time. The decreased time used for test wafer processing and analysis increases the yield and overall production of the semiconductor device fabrication process.

Returning to FIG. 1, in operation 108 the product offset is analyzed to determine whether the product offset is stable. In some embodiments, the product offset is considered stable if the product offset is independent of processing time. In some embodiments, the product offset is considered stable if a variation of the product offset for different products is within a pre-determined tolerance. In some embodiments, the variation is calculated using a magnitude of a difference between a greatest product offset and a smallest product offset. In some embodiments, the variation is calculated using statistical analysis such as standard deviation, average, or other suitable calculations. In some embodiments, if an amount of historical data available for calculating the product offset is below a threshold value, the data is considered insufficiently reliable the product offset is considered not to be stable.

If the product offset is determined to be stable, method 100 continues with operation 110 in which the offset time for a product/processing tool combination is determined based on the processing tool offset. The offset time of the product/processing tool combination does not account for offset contributed by the product. In some embodiments, the processing tool offset is determined based on analysis of historical data for the specific processing tool. In some embodiments, the historical data analysis includes a regression analysis, a histogram analysis or other suitable statistical analysis of previous usage of the processing tool.

If the product offset is determined not to be stable, method 100 continues with operation 112, in which the offset time is determined by processing at least one test wafer. The offset time includes both processing tool offset and product offset which are both a function of processing time. In some embodiments, a group of test wafers are processed and analyzed to determine the offset time.

Figure 5:
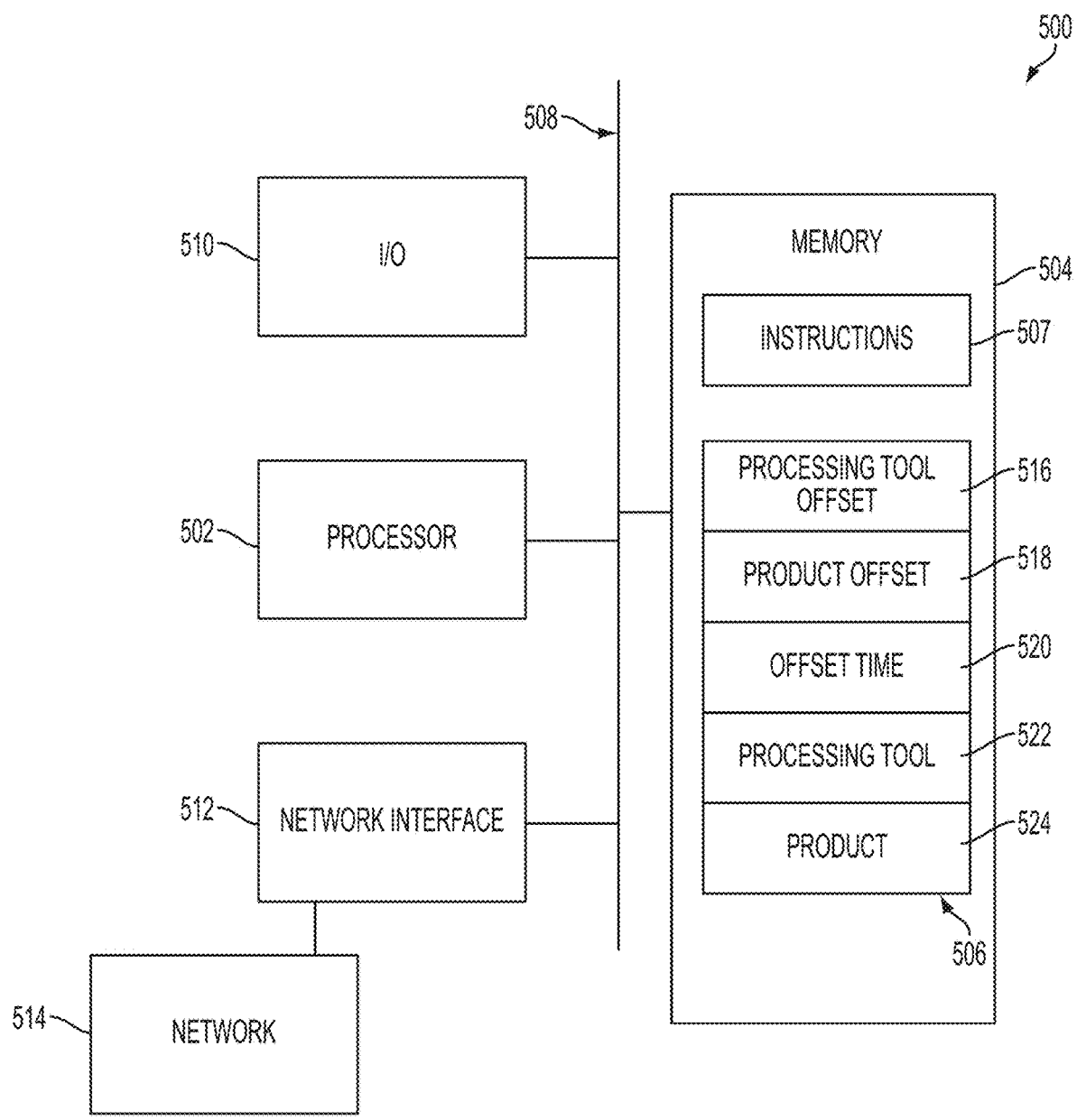
FIG. 5 is a schematic view of a control system for implementing a method such as that of FIG. 1 in accordance with one or more embodiments.

FIG. 5 is a schematic view of a control system 500 for implementing the method of FIG. 1 in accordance with one or more embodiments. Control system 500 includes a hardware processor 502 and a non-transitory, computer readable storage medium 504 encoded with, i.e., storing, the computer program code 506, i.e., a set of executable instructions. Computer readable storage medium 504 is also encoded with instructions 507 for interfacing with manufacturing machines for producing the memory array. The processor 502 is electrically coupled to the computer readable storage medium 504 via a bus 508. The processor 502 is also electrically coupled to an I/O interface 510 by bus 508. A network interface 512 is also electrically connected to the processor 502 via bus 508. Network interface 512 is connected to a network 514, so that processor 502 and computer readable storage medium 504 are capable of connecting to external elements via network 514. The processor 502 is configured to execute the computer program code 506 encoded in the computer readable storage medium 504 in order to cause system 500 to be usable for performing a portion or all of the operations as described in method 100.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 504 stores the computer program code 506 configured to cause system 500 to perform method 100. In some embodiments, the storage medium 504 also stores information needed for performing a method 100 as well as information generated during performing the method 100, such as a processing tool offset parameter 516, a product offset parameter 518, an offset time parameter 520, a processing tool parameter 522, a product parameter 524 and/or a set of executable instructions to perform the operation of method 100.

In some embodiments, the storage medium 504 stores instructions 507 for interfacing with manufacturing machines. The instructions 507 enable processor 502 to generate manufacturing instructions readable by the manufacturing machines to effectively implement method 100 during a manufacturing process.

Control system 500 includes I/O interface 510. I/O interface 510 is coupled to external circuitry. In some embodiments, I/O interface 510 includes a keyboard, keypad, mouse, trackball, trackpad, and/or cursor direction keys for communicating information and commands to processor 502.

Control system 500 also includes network interface 512 coupled to the processor 502. Network interface 512 allows system 500 to communicate with network 514, to which one or more other computer systems are connected. Network interface 512 includes wireless network interfaces such as BLUETOOTH, WIFI, WIMAX, GPRS, or WCDMA; or wired network interface such as ETHERNET, USB, or IEEE-1394. In some embodiments, method 100 is implemented in two or more systems 500, and information such as processing tool offset, product offset, offset time, processing tool and product are exchanged between different systems 500 via network 514. System 500 is configured to receive information related to a processing tool offset time through I/O interface 510. The information is transferred to processor 502 via bus 508 to determine a processing tool offset. The processing tool offset is then stored in computer readable medium 504 as processing tool parameter 516. Control system 500 is configured to receive information related to product offset time through I/O interface 510. The information is stored in computer readable medium 504 as product offset parameter 518. Control system 500 is configured to receive information related to offset time through I/O interface 510. The information is stored in computer readable medium 504 as offset time parameter 520. Control system 500 is configured to receive information related to processing tool used through I/O interface 510. The information is stored in computer readable medium 504 as processing tool parameter 522. Control system 500 is configured to receive information related to a product being produced through I/O interface 510. The information is stored in computer readable medium 504 as product parameter 524. In some embodiments, the information related to at least one of offset time, processing tool used and product being produced are extracted from memory array layout parameter 518 by processor 502 and stored as the appropriate parameter in computer code 506.

During operation, processor 502 executes a set of instructions to determine a product offset time based on product offset parameter 516. For method 100, if the product offset time is stable, processor 502 determines the offset time for storing in offset time parameter 520 based on processing tool offset parameter 516. If the product time offset time is not stable, processor 502 provides instructions through I/O interface 510 or network interface 512 to process and analyze a group of test wafers.

An aspect of this description relates to a method. The method includes calculating a processing tool offset for a processing tool based on process control parameters, wherein the processing tool offset is a first portion of a process offset time attributable to a processing tool. The method further includes calculating a product offset based on the process control parameters, wherein the product tool offset is a second portion of the process offset time attributable to a product. The method further includes determining whether the product offset is stable based on a difference between a processing time for different products being within a pre-determined tolerance and a number of processed wafers exceeding a threshold amount. The method further includes calculating an offset time for processing the product using the processing tool based on the calculated processing tool offset, without considering the product offset in response to a determination that the product offset is stable. In some embodiments, the method further includes calculating the offset time for processing the product using the processing tool based on the calculated processing tool offset and the calculated product offset in response to a determination that the product offset is not stable. In some embodiments, calculating the processing tool offset includes averaging process control parameters for the processing tool. In some embodiments, calculating the product offset includes averaging process control parameters for the product. In some embodiments, the method further includes manufacturing a semiconductor device using the processing tool based on the calculated offset time. In some embodiments, determining whether the product offset is stable includes performing a statistical analysis of the product offset based on historical data; and determining the product offset to be stable if a difference between the processing time for the different products is within the pre-determined tolerance. In some embodiments, determining whether the product offset is stable includes determining whether the number of processed wafers exceeds the threshold value; and determining the product offset to not be stable if the number does not exceed the threshold amount.

An aspect of this description relates to a method. The method includes removing a first processing tool from a production line. The method further includes inserting a second processing tool into the production line. The method further includes determining an offset time for processing a product using the second processing tool. Determining the offset time of the second processing tool includes calculating a processing tool offset of the second processing tool based on the collected process control parameters, wherein the processing tool offset is a first portion of a process offset time attributable to a processing tool. Determining the offset time of the second processing tool further includes calculating a product offset based on the collected process control parameters, wherein the product tool offset is a second portion of the process offset time attributable to a product. Determining the offset time of the second processing tool includes determining whether the product offset is stable, wherein the determining whether the product offset is stable is based on a difference between a processing time for different products being within a pre-determined tolerance and a number of processed wafers exceeding a threshold amount. Determining the offset time of the second processing tool further includes calculating the offset time based on the calculated processing tool offset, without considering the product offset, in response to a determination that the product offset is stable. In some embodiments, the method further includes manufacturing a semiconductor device using the calculated offset time. In some embodiments, determining the offset time of the second processing tool further includes calculating the offset time based on the calculated processing tool offset and the calculated product offset in response to a determination that the product offset is not stable. In some embodiments, determining the offset time of the second processing tool further includes calculating the offset time based on processing at least one test wafer in response to a determination that the product offset is not stable. In some embodiments, the method further includes removing the second processing tool from the production line; and returning the first processing tool to the production line. In some embodiments, the method further includes determining a second offset time of the first process tool prior to returning the first processing tool to the production line. In some embodiments, determining whether the product offset is stable includes performing a statistical analysis of the product offset based on historical data for the second processing tool; and determining the product offset to be stable if a difference between a processing time for different products is within a pre-determined tolerance. In some embodiments, determining whether the product offset is stable includes determining whether a number of wafers processed by the second processing tool exceeds a threshold value; and determining the product offset to not be stable if the number does not exceed the threshold amount.

An aspect of this description relates to a control system. The control system includes a processing tool; a processor connected to the processing tool; and a non-transitory computer readable medium connected to the processor. The non-transitory computer readable medium including instructions for calculating a processing tool offset based on the collected process control parameters, wherein the processing tool offset is a first portion of a process offset time attributable to a processing tool; calculating a product offset, of the product, based on the collected process control parameters, wherein the product offset is a second portion of the process offset time attributable to a product; determining whether the product offset is stable, wherein the determining whether the product offset is stable is based on a difference between a processing time for different products being within a pre-determined tolerance and a number of processed wafers exceeding a threshold amount; and calculating, using the processor, an offset time for processing the product by the processing tool based on the calculated processing tool offset, without considering the product offset, in response to a determination that the product offset is stable. In some embodiments, the non-transitory computer readable medium further includes instructions for calculating the offset time for processing the product using the processing tool, using the processor, based on the calculated processing tool offset and the calculated product offset in response to a determination that the product offset is not stable. In some embodiments, the non-transitory computer readable medium further includes instructions for instructing the processing tool to manufacture a semiconductor device based on the calculated offset time. In some embodiments, the non-transitory computer readable medium further includes instructions for performing a statistical analysis of the product offset based on historical data for the processing tool; and determining the product offset to be stable if a difference between a processing time for different products is within a pre-determined tolerance. In some embodiments, the non-transitory computer readable medium further includes instructions for determining whether a number of wafers processed by the processing tool exceeds a threshold value; and determining the product offset to not be stable if the number does not exceed the threshold amount.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. A method comprising:
 calculating a processing tool offset for a processing tool based on process control parameters, wherein the pro- cessing tool offset is a first portion of a process offset time attributable to a processing tool;

calculating a product offset based on the process control parameters, wherein the product tool offset is a second portion of the process offset time attributable to a product;

determining whether the product offset is stable based on a difference between a processing time for different products being within a pre-determined tolerance and a number of processed wafers exceeding a threshold amount; and calculating an offset time for processing the product using the processing tool based on the calculated processing tool offset, without considering the product offset in response to a determination that the product offset is stable; and manufacturing a semiconductor device using the processing tool based on the calculated offset time.

2. The method of claim 1, further comprising calculating the offset time for processing the product using the processing tool based on the calculated processing tool offset and the calculated product offset in response to a determination that the product offset is not stable.

3. The method of claim 1, wherein calculating the processing tool offset comprises averaging process control parameters for the processing tool.

4. The method of claim 1, wherein calculating the product offset comprises averaging process control parameters for the product.

5. The method of claim 1, wherein the determining whether the product offset is stable comprises:
performing a statistical analysis of the product offset based on historical data; and
determining the product offset to be stable if a difference between the processing time for the different products is within the pre-determined tolerance.

6. The method of claim 1, wherein the determining whether the product offset is stable comprises:
determining whether the number of processed wafers exceeds the threshold value; and
determining the product offset to not be stable if the number does not exceed the threshold amount.

7. A method comprising:
removing a first processing tool from a production line;
inserting a second processing tool into the production line; and
determining an offset time for processing a product using the second processing tool, wherein determining the offset time of the second processing tool comprises:
calculating a processing tool offset of the second processing tool based on the collected process control parameters, wherein the processing tool offset is a first portion of a process offset time attributable to a processing tool;
calculating a product offset based on the collected process control parameters, wherein the product tool offset is a second portion of the process offset time attributable to a product;
determining whether the product offset is stable, wherein the determining whether the product offset is stable is based on a difference between a processing time for different products being within a pre-determined tolerance and a number of processed wafers exceeding a threshold amount;
calculating the offset time based on the calculated processing tool offset, without considering the product offset, in response to a determination that the product offset is stable; and
manufacturing a semiconductor device using the calculated offset time.

8. The method of claim 7, wherein determining whether the product offset is stable comprises:
performing a statistical analysis of the product offset based on historical data for the second processing tool; and
determining the product offset to be stable if a difference between a processing time for different products is within a pre-determined tolerance.

9. The method of claim 7, wherein determining whether the product offset is stable comprises:
determining whether a number of wafers processed by the second processing tool exceeds a threshold value; and
determining the product offset to not be stable if the number does not exceed the threshold amount.

10. The method of claim 7, wherein determining the offset time of the second processing tool further comprises calculating the offset time based on the calculated processing tool offset and the calculated product offset in response to a determination that the product offset is not stable.

11. The method of claim 7, wherein determining the offset time of the second processing tool further comprises calculating the offset time based on processing at least one test wafer in response to a determination that the product offset is not stable.

12. The method of claim 7, further comprising:
removing the second processing tool from the production line; and
returning the first processing tool to the production line.

13. The method of claim 12, further comprising determining a second offset time of the first process tool prior to returning the first processing tool to the production line.

14. A control system comprising:
a processing tool;
a processor connected to the processing tool; and
a non-transitory computer readable medium connected to the processor, the nontransitory computer readable medium including instructions for:
calculating a processing tool offset based on the collected process control parameters, wherein the processing tool offset is a first portion of a process offset time attributable to a processing tool;
calculating a product offset, of the product, based on the collected process control parameters, wherein the product offset is a second portion of the process offset time attributable to a product;
determining whether the product offset is stable, wherein the determining whether the product offset is stable is based on a difference between a processing time for different products being within a pre-determined tolerance and a number of processed wafers exceeding a threshold amount; and
calculating, using the processor, an off-set time for processing the product by the processing tool based on the calculated processing tool offset, without considering the product offset, in response to a determination that the product offset is stable; and
instructing the processing tool to manufacture a semiconductor device based on the calculated off set time.

15. The control system of claim 14, wherein the non-transitory computer readable medium further includes instructions for:
performing a statistical analysis of the product offset based on historical data for the processing tool; and determining the product offset to be stable if a difference between a processing time for different products is within a pre-determined tolerance.

16. The control system of claim 14, wherein the non-transitory computer readable medium further includes instructions for:
determining whether a number of wafers processed by the processing tool exceeds a threshold value; and
determining the product offset to not be stable if the number does not exceed the threshold amount.

17. The control system of claim 14, wherein the non-transitory computer readable medium further includes instructions for calculating the offset time for processing the product using the processing tool, using the processor, based on the calculated processing tool offset and the calculated product offset in response to a determination that the product offset is not stable.

* * * * *